United States Patent [19]
Rohde et al.

[11] Patent Number: 4,656,116
[45] Date of Patent: Apr. 7, 1987

[54] RADIATION-SENSITIVE COATING COMPOSITION

[75] Inventors: Ottmar Rohde, Basel; Josef Pfeifer, Therwil, both of Switzerland

[73] Assignee: Ciba-Geigy Corporation, Ardsley, N.Y.

[21] Appl. No.: 657,868

[22] Filed: Oct. 4, 1984

[30] Foreign Application Priority Data

Oct. 12, 1983 [CH] Switzerland .................... 5572/83

[51] Int. Cl.$^4$ .................... G03C 1/71; G03C 1/52
[52] U.S. Cl. .................... 430/197; 260/349; 430/196; 430/283; 430/285; 430/325; 430/330; 430/927; 522/39; 522/176
[58] Field of Search .............. 430/197, 330, 325, 283, 430/285, 927, 196; 260/349; 204/159.14, 159.19; 522/39, 176

[56] References Cited

U.S. PATENT DOCUMENTS

| | | | |
|---|---|---|---|
| 3,957,512 | 5/1976 | Kleeberg et al. | 96/35.1 |
| 4,118,374 | 10/1978 | Yamazaki et al. | 528/346 |
| 4,197,133 | 4/1980 | Zweifel et al. | 430/197 |
| 4,287,294 | 9/1981 | Rudner et al. | 430/306 |
| 4,292,398 | 9/1981 | Rubner et al. | 430/322 |
| 4,451,551 | 5/1984 | Kataoka et al. | 430/920 |
| 4,547,455 | 10/1985 | Hiramoto et al. | 430/197 |

FOREIGN PATENT DOCUMENTS 65352  4/1982  European Pat. Off. ............ 430/192

Primary Examiner—Charles L. Bowers, Jr.
Attorney, Agent, or Firm—Harry Falber

[57] ABSTRACT

Polyimides of aromatic tetracarboxylic acid derivatives and aromatic diamines where both ortho-positions relative to a phenylene radical bonded to an imide group of the polymer are substituted by alkyl groups can be radiation-crosslinked with organic chromophoric polyazides. Solutions of said polyimides and polyazides in organic solvents can be used as radiation-sensitive coating compositions for, for example, preparing insulating and protective films and in particular for producing printed circuits and integrated circuits.

19 Claims, No Drawings

RADIATION-SENSITIVE COATING COMPOSITION

The present invention relates to a radiation-sensitive coating composition containing a polyimide dissolved in an organic solvent and an organic chromophoric polyazide, to a photographic recording material for relief images and to the use of the coating composition for preparing insulating and protective finishes, in particular for producing printed circuits, discrete semiconductor devices and integrated circuits.

Polyimides are very heat-resistant, and therefore they are used as insulating and protective films in electronics and semiconductor technology. These films are usually required in the form of relief structures, and it is thought to be particularly desirable to be able to produce these structures photolithographically by local irradiation with high-energy radiation. As polyimides are generally insoluble in organic solvents, the starting materials are either their soluble precursors, which, after various pretreatments, are then structured by additionally coating them with photoresist and removing the uncovered portions, or soluble precursors which carry chemically bonded radiation-sensitive groups or are mixed with radiation-sensitive groups. Both as a result of polyimide formation, which is not effected by thermal cyclisation until after the image has been generated, and as a result of the photoreactive side groups, which account for a not inconsiderable portion of the total weight, being split off, the generated relief structures suffer an appreciable loss of film thickness on heating and a marked contraction in the lateral dimensions. This is regarded as a particular disadvantage, since it has been found to be remarkably difficult to generate true to life images of a given mask, and since the generated relief images exert a not inconsiderable tension on the substrate. Moreover, in the case of systems having photoreactive side groups the technically complicated preparation of the precursors is uneconomical. Furthermore, the various additives prevent the polyimides thus prepared from developing the good electrical, mechanical and thermal properties which are otherwise inherent in these polymers. Such precursors and systems are described for example in German Offenlegungsschrift No. 2,308,830, German Offenlegungsschrift No. 2,914,619, European Patent Publication No. 0,065,352 and Japanese Preliminary Published Application No. 57-143,329.

To avoid the disadvantages mentioned it is extremely desirable to be able to accomplish direct crosslinking by means of high-energy radiation and hence to have the option of directly photostructuring polyimides.

It has now been found that said disadvantages, in particular film thickness losses and contractions of the relief structures in the lateral dimensions both after the developing and under thermal stress, can be avoided by using polyimides of certain aromatic tetracarboxylic acid derivatives and aromatic diamines where both ortho-positions on a phenylene radical bonded to an imide group of the polymer are substituted by alkyl groups. The polyimides prepared therefrom are distinguished by being readily soluble in organic solvents, by having a surprisingly high heat resistance (high glass transition temperatures) and by being highly heat-resistant in the absence of air and can be directly radiation-crosslinked with chromophoric aromatic polyazides to produce highly resolved image structures. Furthermore, these polyimides, owing to the good solubilising action of said diamines, can additionally be modified and improved by using other not necessarily self-solubilising comonomer units.

The present invention thus provides a radiation-sensitive coating composition containing, in addition to customary additives, (a) an organic solvent, (b) a homopolyimide or copolyimide which is soluble in this solvent and which essentially comprises 50 to 100 mol % of recurring structural elements of the formulae Ia and/or Ib.

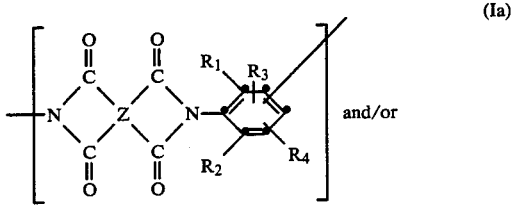

(Ia)

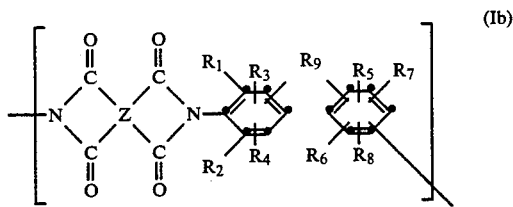

(Ib)

and 50 to 0 mol % of recurring structural elements of the formula II

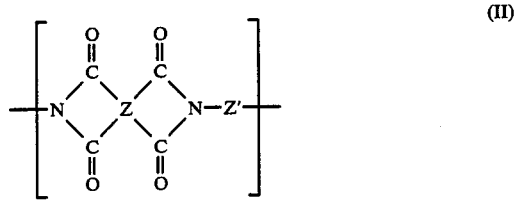

(II)

and (c) at least 0.1% by weight, based on component (b), of at least one organic chromophoric polyazide in which the azide groups are bonded to aromatic hydrocarbons either directly or via an $SO_2$ group, the four carbonyl groups in the formulae Ia, Ib and II being bonded to different carbon atoms and any two carbonyl groups being in ortho- or periposition relative to each other, Z being a tetravelent radical which contains at least one aromatic ring, Z' being a divalent organic radiacal which differs from the groups of the formulae

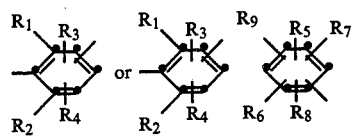

and is selected from among aromatic, alkylaromatic, aliphatic, cycloaliphatic and heterocyclic radicals, combinations thereof and radicals having oxygen-, sulfur-, nitrogen-, silicon- or phosphorus-containing bridge groups, $R_1$ and $R_2$, independently of each other, each being alkyl having 1–4 C atoms, $R_3$, $R_4$, $R_5$, $R_6$, $R_7$ and $R_8$, independently of one another, each being hydrogen or alkyl having 1–4 C atoms and $R_9$ being a direct bond,

—O—, —S—, —SO—, —S—S—, —SO$_2$—, —CO—, —COO—, —NH—,

alkyl having 1-6 C atoms in the alkyl,

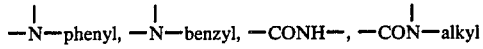

having 1-6 C atoms in the alkyl,

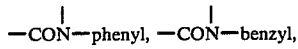

a linear or branched alkylene group having 1-3 C atoms, alkylidene having 2-12 C atoms, cycloalkylidene having 5-6 ring carbon atoms, phenylene,

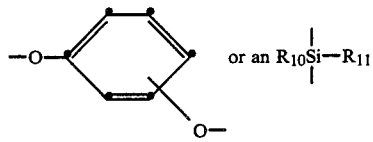

group in which $R_{10}$ and $R_{11}$ are each alkyl or alkoxy having 1-6 C atoms each, phenyl, benzyl, phenyloxy or benzyloxy.

The copolyimides can be random polymers or block copolymers. The degree of polymerisation (the number of recurring structural elements) is preferably at least 20 and can be, 1,000 or more. A degree of polymerisation of 50 to 500, in particular 100 to 300, is particularly preferred.

Alkyl groups $R_1$ to $R_8$, $R_{10}$ and $R_{11}$, alkyl groups in $R_9$ radicals and alkoxy groups $R_{10}$ and $R_{11}$ can be straight-chain or branched. Examples are methyl, ethyl, n-propyl, isopropyl, n-butyl, sec.-butyl, tert.-butyl, n-pentyl, 2-pentyl, n-hexyl, methoxy, ethoxy, n-propoxy, isopropoxy, n-butoxy, n-phentyloxy and n-hexyloxy. An

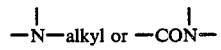

alkyl group $R_9$ is in particular an

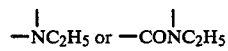

group and very particularly an

group. A linear or branched alkylene group $R_9$ is preferably ethylene or especially methylene.

An alkylidene or cycloalkylidene group $R_9$ is for example an ethylidene, 1,1- or 2,2-propylidene or 1,1- or 2,2-butylidene group or a cyclopentylidene or cyclohexylidene group. An alkylidene group $R_9$ is preferably a 2,2-propylidene group (the isopropylidene group). Dialkylsilyl and dialoxysilyl groups

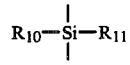

preferably have 1 or 2 C atoms in the alkyl or alkoxy groups. The Zs and Z's can be differently defined in the individual structural elements.

$R_1$ and $R_2$ are each preferably independently of each other methyl or ethyl. $R_3$ to $R_8$ are each preferably independently of one another hydrogen, methyl or ethyl, and $R_9$ is preferably —CH$_2$—, —O—, —CO— or a direct bond.

In preferred polyimides and copolyimides having recurring structural elements of the formula Ia, $R_1$ and $R_2$ are both ethyl and in particular methyl and $R_3$ and $R_4$, independently of each other, are each hydrogen or methyl. The free bond is preferably in the meta- and in particular in the para-position relative to the N atom. They are in particular polyimides or copolyimides which are derived from diamines of the formulae A, B, C or D

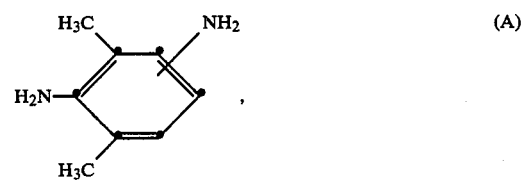

(A)

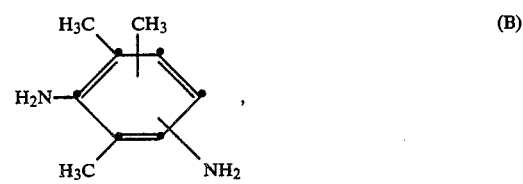

(B)

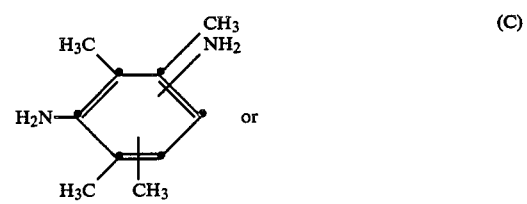

(C)

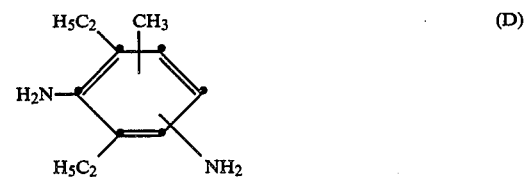

(D)

or mixtures thereof in which the amino groups are in the meta- and especially in the para-position relative to each other.

Polyimides or copolyimides having recurring structural elements of the formula Ib are preferably derived from symmetrical diamines of the formula III

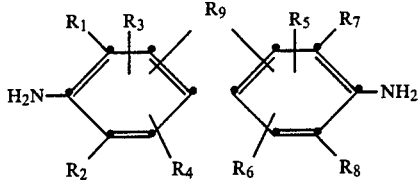
(III)

in which $R_9$ is as defined above and is in particular a direct bond, —CH$_2$— or —CO—, $R_1$, $R_2$, $R_7$ and $R_8$ are all C$_1$—C$_4$ alkyl, and $R_3$ and $R_5$ on the one hand and $R_4$ and $R_6$ on the other are defined the same way and are each hydrogen or C$_{1-4}$-alkyl. Particularly preferably $R_3$ to $R_6$ are each hydrogen and $R_1$, $R_2$, $R_7$ and $R_8$ are each C$_{1-4}$-alkyl, in particular ethyl and especially methyl. Very particularly preferred polyimides or copolyimides having recurring structural elements of the formula Ib are derived from diamines of the formula IIIa

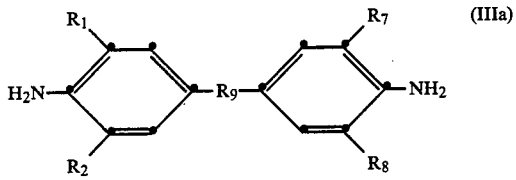
(IIIa)

in which $R_1$ and $R_7$ are each methyl, $R_2$ and $R_8$ are each ethyl or especially methyl and $R_9$ is a direct bond or —CO— or in particular —CH$_2$—.

Specific examples of diamines which are suitable for preparing such polyimides having structural elements of the formula Ia or Ib are 1,4-diamino-2,3,5,6-tetramethylbenzene (durenediamine), 1,3-diamino-2,4,5,6-tetramethylbenzene (isodurenediamine), 1,4-diamino-2,5,6-trimethylbenzene, 1,3-diamino-2,4,6- or 2,5,6-trimethylbenzene, 1,3-diamino-2,6-diethyl-4-methylbenzene, 1,4-diamino-2,6-diethyl-3-methylbenzene, 1,4-diamino-2,6-dimethylbenzene, 1,3-diamino-2,6-dimethylbenzene, 4,4'-diamino-3,3',5,5'-tetramethyldiphenylmethane, 3,3'-diamino-2,2',4,4'-tetramethyldiphenylmethane, 4,4'-diamino-3,3'-diethyl-5,5'-dimethyldiphenylmethane, 4,4'-diamino-2,2',3,3',5,5',6,6'-octamethyldiphenylmethane and 4,4'-diamino-3,3',5,5'-tetramethylbenzophenone.

Z can be for example a phenylindan radical of the formula IV

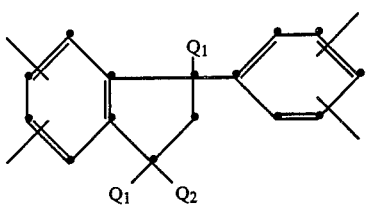
(IV)

in which Q$_1$ is hydrogen or alkyl having 1 to 5 carbon atoms and Q$_2$ is alkyl having 1 to 5 carbon atoms.

Examples of phenylindan dianhydride components having a radical of the formula IV are 1-(3',4'-dicarboxyphenyl)-1,3,3-trimethylindan-5,6-dicarboxylic acid dianhydride, 1-(3',4'-dicarboxyphenyl)-1,3,3-trimethylindan-6,7-dicarboxylic acid dianhydride, 1-(3',4'-dicarboxyphenyl)-3-methylindan-5,6-dicarboxylic acid dianhydride and 1-(3',4'-dicarboxyphenyl)-3-methylindan-6,7-dicarboxylic acid anhydride.

A non-phenylindan radical Z can be selected from among the following groups: aromatic, aliphatic, cycloaliphatic and heterocyclic groups and combinations of aromatic and aliphatic groups. The groups can also be substituted. Z groups preferably have one or more of the following structures:

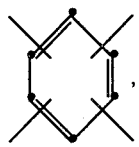
(1)

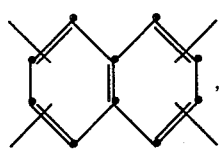
(2)

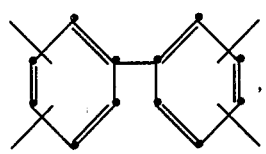
(3)

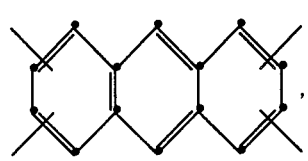
(4)

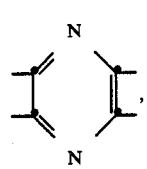
(5)

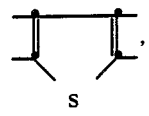
(6)

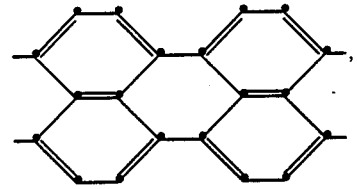
(7)

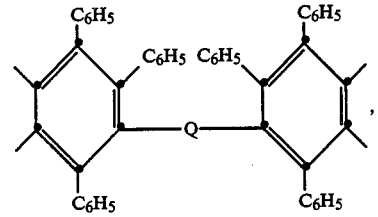
(8)

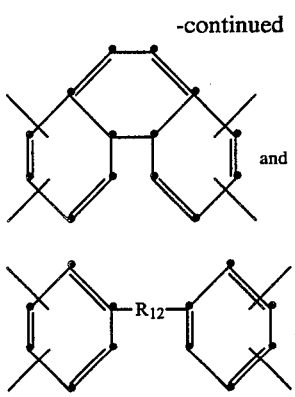

in which Q is 1,3- or 1,4-phenylene or a diphenyl ether radical and $R_{12}$ is selected from the group comprising

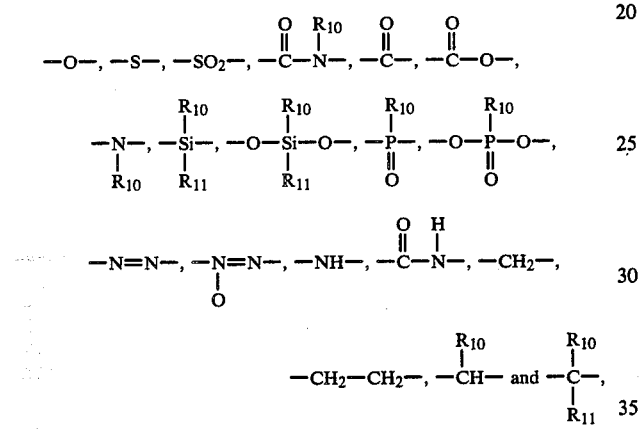

where $R_{10}$ and $R_{11}$ are each alkyl or alkoxy having 1 to 6 C atoms each, phenyl, benzyl, phenyloxy or benzyloxy. Tetracarboxylic acid dianhydrides in which Z is a radical of the formula (8) are described for example in F. W. Harris and R. B. Seymour: "Structure and Solubility Relationships in Polymers", Academic Press, New York, pages 183–198 (1977).

Examples of suitable tetracarboxylic acid dianhydrides having a tetravalent radical Z are 2,3,9,10-perylenetetracarboxylic acid dianhydride, 1,4,5,8-naphthalenetetracarboxylic acid dianhydride, 2,6-dichloronaphthalene-1,4,5,8-tetracarboxylic acid dianhydride, 2,7-dichloronaphthalene-1,4,5,8-tetracarboxylic acid dianhydride, 2,3,6,7-tetrachloronaphthalene-1,4,5,8-tetracarboxylic acid dianhydride, phenanthrene-1,8,9,10-tetracarboxylic acid dianhydride, 2,3,3',4'-benzophenonetetracarboxylic acid dianhydride, pyromellitic acid dianhydride, 3,3',4,4'-benzophenonetetracarboxylic acid dianhydride, 2,2',3,3'-benzophenonetetracarboxylic acid dianhydride, 3,3',4,4'-biphenyltetracarboxylic acid dianhydride, 2,2',3,3'-biphenyltetracarboxylic acid dianhydride, 4,4'-isopropylidenediphthalic acid anhydride, 3,3'-isopropylidenediphthalic acid anhydride, 4,4'-oxydiphthalic acid anhydride, 3,3'-oxydiphthalic acid anhydride, 4,4'-sulfonyldiphthalic acid anhydride, 4,4'-methylenediphthalic acid anhydride, 4,4'-hydroxymethylenediphthalic acid anhydride, 4,4'-thiodiphthalic acid anhydride, 4,4'-ethylidenediphthalic acid anhydride, 2,3,6,7-naphthalenetetracarboxylic acid dianhydride, 1,2,4,5naphthalenetetracarboxylic acid dianhydride, 1,2,5,6-naphthalenetetracarboxylic acid dianhydride, benzene-1,2,3,4-tetracarboxylic acid dianhydride, pyrazine-2,3,5,6-tetracarboxylic acid dianhydride, thiophene-2,3,4,5-tetracarboxylic acid dianhydride, 1-(3',4'-dicarboxyphenyl)-1,3,3-trimethylindan-5,6-dicarboxylic acid dianhydride, 1-(3',4'-dicarboxyphenyl)-1,3,3-trimethylindan-6,7-dicarboxylic acid dianhydride, 1-(3',4'-dicarboxyphenyl)-3-methylindan-5,6-dicarboxylic acid dianhydride, tetrahydrofurantetracarboxylic acid dianhydride, cyclopentanetetracarboxylic acid dianhydride, cyclooctanetetracarboxylic acid dianhydride and 1-(3',4'-dicarboxyphenyl)-3-methylindan-6,7-dicarboxylic acid dianhydride and dianhydrides of the general formula V

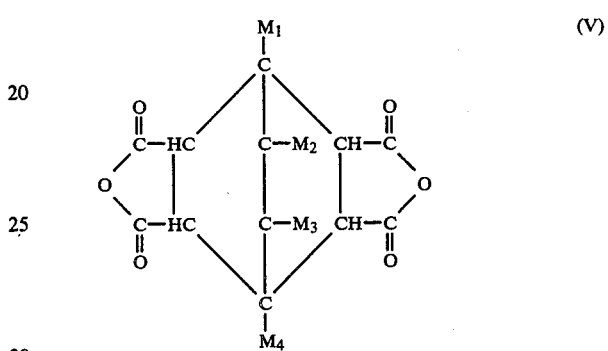

in which $M_1$, $M_2$, $M_3$ and $M_4$, independently of one another, are each hydrogen or alkyl having 1–6 C atoms each, in particular methyl.

Z is particularly preferably the radical of pyromellitic acid dianhydride, a radical of the formula VI

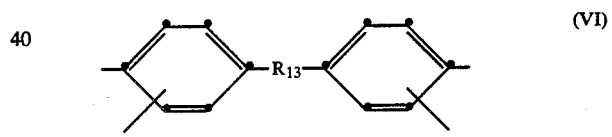

or a mixture of these radicals, in which $R_{13}$ is a direct bond, —$CH_2$—, —O—, —$SO_2$— or —CO—.

Z is very particularly preferably the radical of pyromellitic acid dianhydride, a radical of the formula VIa

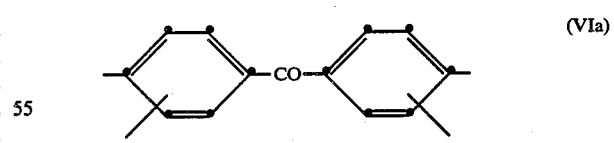

or a mixture of these radicals.

The Z' group defined above can be selected from among alkylene groups having 2–12 C atoms, cycloalkylene groups having 4–6 ring carbon atoms, a xylylene group, substituted or unsubstituted arylene groups, for example ortho-, meta- or para-phenylene, tolylene, halogen-substituted phenylene, naphthylene or anthrylene, a bicyclic aromatic compound of the formula VII

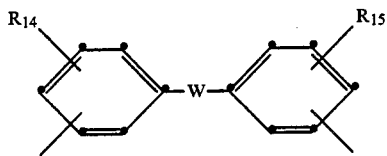

in which W is a direct bond. —S—, —CO—, —NH—,

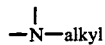

having 1-5 C atoms in the alkyl, —O—, —SO—, —S—S—,

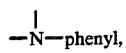

—SO$_2$—, a linear or branched alkylene group having 1-3 C atoms, alkylidene having 2-12 C atoms, cycloalkylidene having 5 or 6 ring carbon atoms, phenylene or an

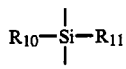

group, $R_{14}$ and $R_{15}$, independently of each other, are both hydrogen, halogen, in particular chlorine or bromine, alkyl or alkoxy having 1-5 C atoms, in particular methyl or methoxy, or aryl, in particular phenyl, and $R_{10}$ and $R_{11}$ are as defined above. Examples of suitable alkylidene, cycloalkylidene or

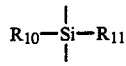

groups are mentioned under $R_9$. Radicals of the formula VII are preferably bonded in the 3,3'- or especially the 4,4'-position.

Furthermore, the group Z' can be of the formula VIII or IX

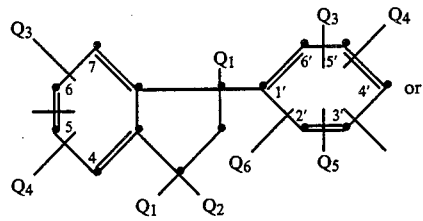

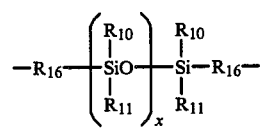

in which $Q_1$, $Q_2$, $R_{10}$ and $R_{11}$ are as defined above, $Q_3$, $Q_4$, $Q_5$ and $Q_6$, independently of one another, are each hydrogen, alkyl or alkoxy having 1-4 C atoms each or halogen, $R_{16}$ is a divalent hydrocarbon radical, for example cycloalkylene having 5 or 6 ring carbon atoms or phenylene and in particular alkylene having 1-12 preferably 1-6, C atoms, and x is a integer from 1 to 50. Diamines having this Z' group are described in U.S. Pat. No. 4,030,948. In preferred groups of the formula IX, x is 1, the $R_{10}$s and $R_{11}$s are each methyl and $R_{16}$ is alkylene having 1-6 and especially 3 C atoms.

Alkyls $Q_1$ and $Q_2$ can be methyl, ethyl, propyl, isopropyl, n-butyl or n-pentyl. Particularly preferably $Q_1$ is hydrogen or methyl and $Q_2$ is methyl.

Halogens $Q_3$, $Q_4$, $Q_5$ and $Q_6$ are preferably chlorine or bromine. Alkoxy radicals $Q_3$, $Q_4$, $Q_5$ and $Q_6$ are for example n-butoxy, n-propoxy, ethoxy or in particular methoxy; alkyl radicals $Q_3$, $Q_4$, $Q_5$ and $Q_6$ are for example n-butyl, tertiary butyl, n-propyl, isopropyl, ethyl or in particular methyl. $Q_3$, $Q_4$, $Q_5$ and $Q_6$ are particularly preferably, independently of one another, hydrogen, methyl or chlorine.

The phenylindandiamine component of the polyimide can consist of any combination of isomeric or substituted isomeric radicals of the formula VIII. For instance, the phenyl-indandiamine component can comprise for example 0 to 100 mol % of 5-amino-1-(4'-aminophenyl)-1,3,3-trimethylindan combined with 100 to 0 mol % of 6-amino-1-(4'-aminophenyl)-1,3,3-trimethylindan. Examples of substituted diamino isomers which can be used as starting materials are 5-amino-6-methyl-1-(3'-amino-4'-methylphenyl)-1,3,3-trimethylindan, 5-amino-1-(4'-amino-Ar',Ar'-dichlorophenyl)-Ar,Ar-dichloro-1,3,3-trimethylindan, 6-amino-1-(4'-amino-Ar',Ar'-dichlorophenyl)-Ar,Ar-dichloro-1,3,3-trimethylindan, 4-amino-6-methyl-1-(3'-amino-4'-methylphenyl)-1,3,3-trimethylindan and Ar-amino-1-(Ar'-amino-2',4'-dimethylphenyl)-1,3,3,4,6-pentamethylindan. Ar and Ar' in the compounds mentioned indicate the undefined position of the indicated substituents in the phenyl rings. The amino groups are preferably in the 7-position, in particular the 5- and 6-positions, and the 3'- and in particular the 4'-positions.

Z' is preferably a group of the formula X

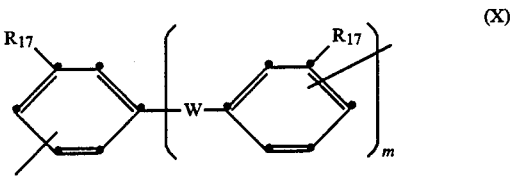

in which W is as defined above and is in particular a direct bond, —O—, —CO— or —CH$_2$—, m is zero or 1, the free bonds are in the meta- and preferably in the ortho-position relative to the $R_{17}$ group, and $R_{17}$ is a hydrogen atom, alkyl or alkoxy having 1-5 C atoms each, in particular methyl, ethyl, isopropyl, methoxy or ethoxy, or a hydrogen atom.

Examples of diamines having a divalent Z' radical are m- and p-phenylenediamine, 4,4'- and 3,3'-diaminobiphenyl, 4,4'- and 3,3'-diaminodiphenyl ether, 4,4'- and 3,3'-diaminodiphenylmethane, 4,4'- and 3,3'-diaminodiphenyl sulfone, 4,4'- and 3,3'-thiodianiline, bis-(4-aminophenyl)bis(triflqoromethyl)methane, 4,4'-diaminobenzophenone, 1,5-diaminonaphthalene, bis-(4-aminophenyl)-dimethylsilane, bis-(4-aminophenyl)diethylsilane, bis-(4-aminophenyl)-diphenylsilane, bis-(4-aminophenyloxy)-dimethylsilane, bis-(4-aminophenyl)-ethylphosphine oxide, N-[bis-(4-aminophenyl)]—N- methylamine, N-[bis-(4-aminophenyl)]—N-phenylamine, 4,4'-methylenebis-(ochloroaniline), 4,4'-methylenebis-(3-methylaniline), 4,4'-methylenebis-(2-ethylaniline), 4,4'-methylenebis-(2-methoxyaniline), 5,5'-methylenebis-(2-aminophenol), 4,4'-methylenebis-(2-methylaniline), 4,4'-oxybis-(2-methoxyaniline), 4,4'-oxybis-(2-chloroaniline), 5,5'-oxybis-(2-aminophenol), 4,4'-thiobis-(2-methylaniline), 4,4'-thiobis-(2-methoxyaniline), 4,4'-thiobis-(2-chloroaniline), 4,4'-sulfonylbis-(2-methylaniline), 4,4'-sulfonylbis-(2-ethoxyaniline), 4,4'-sulfonylbis-(2-chloroaniline), 5,5'-sulfonylbis-(2-aminophenol), 3,3'-dimethyl-4,4'-diaminobenzophenone, 3,3'-dimethoxy-4,4'diaminobenzophenone, 3,3'-dichloro-4,4'-diaminobenzophenone, 4,4'-oxydianiline, 4,4'-isopropylidenedianiline, 3,3'-dichlorobenzidine, 3,3'-dimethylbenzidine, 3,3'-dimethoxybenzidine, 3,3'-dicarboxybenzidine, diaminotoluene, 4,4'-methylenebis-(3-carboxyaniline) and its esters, 5-amino-1-(4-aminophenyl)-1,3,3-trimethylindan and 6-amino-1-(4'-aminophenyl)-1,3,3-trimethylindan.

The tetracarboxylic acid derivatives and diamines which are used for preparing the polyimides of the type defined are known or can be prepared by methods known per se. The polyimides can be prepared, in a manner known per se, by condensing or co-condensing appropriate tetracarboxylic acid derivatives, especially the dianhydrides, with the diamines and subsequently cyclising the polyamide-acids. If desired, polyamide-acid blocks thus obtained and having suitable terminal groups can also be reacted with one another or with appropriate monomers (tetracarboxylic acid derivatives and diamines) and subsequently cyclised.

A preferred sub-group of soluble homopolymers or copolymers (b) for the coating compositions according to the invention essentially comprise 70 to 100 mol % of recurring structural elements of the formula Ia or Ib or mixtures thereof and 30 to 0 mol % of recurring structural elements of the formula II in which Z is the radical of pyromellitic acid anhydride, a radical of the formula VI or a mixture of these radicals, $R_1$ and $R_2$, independently of each other, are each methyl or ethyl, $R_3$ to $R_8$, independently of one another, are each hydrogen, methyl or ethyl, $R_9$ is —$CH_2$—, —O—, —CO— or a direct bond, and $Z'$ is a radical of the formula X - $R_{13}$, m, $R_{17}$ and W being as defined above - or $Z'$ is a radical of the formula IX in which x, $R_{10}$ and $R_{11}$ are as defined above and $R_{16}$ is alkylene having 1–6 C atoms.

Particularly preferred coating compositions contain homopolyimides or copolyimides (b) which essentially comprise 70 to 100 mol % of recurring structural elements of the formula Ia or Ib or mixtures thereof and 30 to 0 mol % of recurring structural elements of the formula II in which Z is the radical of pyromellitic acid dianhydride, a radical of the formula VIa or a mixture of these radicals and in which the structural elements of the formula Ia are derived from diamines of the formulae A, B, C or D or mixtures thereof and the structural elements of the formula Ib are derived from diamines of the formula IIIa, $R_1$, $R_2$, $R_7$, $R_8$ and $R_9$ being as defined under formula IIIa, and $Z'$ is a radical of the formula X in which m is zero or 1, W is a direct bond, —CO— or —$CH_2$— or in particular —O— and $R_{17}$ is a hydrogen atom.

In likewise preferred coating compositions according to the invention, homopolyimide or copolyimide (b) essentially comprises 70 to 100 mol % of recurring structural elements of the formula Ia or Ib or mixtures thereof and 30 to 0 mol % of recurring structural elements of the formula II in which Z is the radical of pyromellitic acid anhydride, a radical of the formula VIa or a mixture of these radicals, and in which the structural elements of the formula Ia are derived from diamines of the formulae A, B, C or D or mixtures thereof and the structural elements of the formula Ib are derived from diamines of the formula IIIa, $R_1$, $R_2$, $R_7$, $R_8$ and $R_9$ being as defined under the formula IIIa, and $Z'$ is a radical of the formula IX in which x is 1, $R_{10}$ and $R_{11}$ are both methyl and $R_{16}$ is alkylene having 1–6 or in particular 3 C atoms.

Very particularly preferred homopolyimides or copolyimides (b) comprise 100 mol % of recurring structural elements of the formula Ia or Ib or mixtures thereof in which Z is the radical of pyromellitic acid dianhydride, a radical of the formula VIa or a mixture of these radicals, and in which the structural elements of the formula Ia are derived from diamines of the formulae A, B, C or D or mixtures thereof and the structural elements of the formula Ib are derived from 4,4'-diamino-3,5,3',5'-tetramethyldiphenylmethane.

Preferred polyimides have a high heat resistance. Particularly preferred polyimides do not decompose at a temperature up to 350° C. or more in air. The quality of the coatings can be assessed on the basis of the electrical properties, such as dielectric constant, loss factor and breakdown voltage, including in particular the specific volume resistance (DIN 53,482) measured under standardised conditions. In this measurement it is desirable that a value of the order of $10^{16}$ ohm.cm or more is obtained even under prolonged thermal stress. It is also known that for polymeric materials to give good photostructuring they should have a very narrow molecular weight distribution. It has been found to be very advantageous to pretreat the soluble polyimides by means of known separating methods, such as fractional precipitation, in order to obtain coating agents having a narrow molecular weight distribution. It is also known that the radiation sensitivity increases with the average molecular weight $\overline{M}_w$. An average molecular weight of 10,000 to 500,000, preferably 20,000 to 300,000 and in particular 30,000 to 200,000, has been found to be advantageous.

Suitable organic solvents in which homopolyimides and copolyimides (b) can be dissolved, if necessary by heating, are polar, especially polar aprotic, solvents which can be used alone or in the form of mixtures of at least two solvents. Examples of suitable solvents are ethers, such as dibutyl ether, tetrahydrofuran, dioxane, methyl ethylene glycol, dimethyl ethylene glycol, dimethyl diethylene glycol, diethyl diethylene glycol or dimethyl triethylene glycol, halogenated aliphatic hydrocarbons, such as methylene chloride, chloroform, 1,2-dichloroethane, 1,1,2-trichloroethane or 1,1,2,2-tetrachloroethane, carboxylic acid esters and lactones, such as ethyl acetate, methyl propionate, ethyl benzoate, 2-methoxyethyl acetate, γ-butyrolactone, δ-valerolactone and mevalolactone, carboxamides and lactams, such as formamide, acetamide, N-methylformamide, N,N-dimethylformamide, N,N-diethylformamide, N,N-dimethylacetamide, N,N-diethylacetamide, Y-butyrolactam, C-caprolactam, N-methylpyrrolidone, N-acetylpyrrolidone, N-methylcaprolactam, tetramethylurea and hexamethylphosphoramide, sulfoxides, such as dimethyl sulfoxide, sulfones, such as dimethyl sulfone, diethyl sulfone, trimethylene sulfone and tetramethylene sulfone, primary, secondary and tertiary amines, such as methylamine, ethylamine, propylamine, pyrrolidine, piperidine, morpholine, dimethylamine, diethylamine, methylethylamine, trimethylamine, triethylamine, N-methylpyrrolidine, N-methylpiperidine and N-methylmorpholine, substituted benzenes, such as chlorobenzene, nitrobenzene and cresol, cycloaliphatic ketones, such as cyclopentanone, cyclohexanone, cycloheptanone, 2-methylcyclohexanone, 3-methylcyclohexanone and 4-methylcyclohexanone, and aromatic ketones, such as acetophenone and propiophenone.

The polyazides (c) are known and are described, for example, in EP-A No. 0,065,352. They can be used alone or in any mixture.

The aromatic hydrocarbon radicals of the chromophoric polyazides (c) can be substituted by 1 or 2 halogen atoms, in particular chlorine, and alkoxy or alkyl groups having 1 to 5 C atoms. Organic chromophoric bisazides, in particular those without imide groups, are preferred. They can be bisazides of the formula XI $$N_3-D-N_3 \qquad (XI)$$

in which D is arylene, such as phenylene, naphthylene, toluylene or perylene.

Particularly preferred bisazides have the formula XII $$N_3-E-(Y)_q-E-N_3 \qquad (XII)$$

in which E is an aromatic hydrocarbon radical, in particular phenylene, q is 0 or 1, and Y is an inorganic or organic group which, together with the aromatic hydrocarbon radicals E, forms a mesomeric system. Y is preferably O, CO, S, SO, SO$_2$, NR' (R' being hydrogen, alkyl, cycloalkyl, aryl or aralkyl),

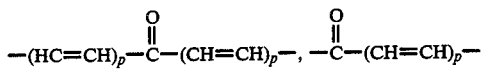

or —(CH=CH)$_p$— where p=1–3, —CH=N—,

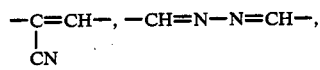

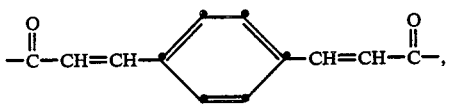

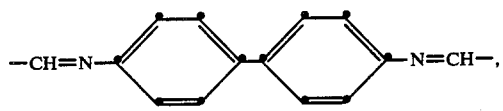

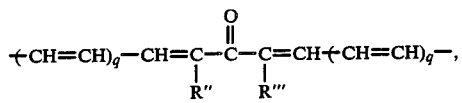

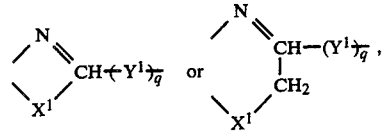

in which R'' and R''', independently of each other, are each alkyl having 1 to 5 C atoms or R'' and R''' together are unsubstituted or alkyl-, hydroxyalkyl-, alkoxy-, trialkylsilyl-, hydroxyl-, carboxyl-, alkoxycarbonyl-, amino-, alkylamino- or dialkylamino-substituted ethylene or trimethylene, q is 0 or 1, X$^1$ is O, S or NH, Y$^1$ is independently defined in the same way as Y, and the free bonds on N and X$^1$, together with the E group, form a fused heterocyclic ring. Y$_1$ is preferably a direct bond or —CH=CH—.

An alkyl R' preferably contains 1–6 C atoms, a cycloalkyl R' preferably contains 5 or 6 ring carbon atoms, an aryl R' preferably contains 6 to 12 C atoms and an aralkyl R' preferably contains 7 to 14 C atoms. Preferred substituents for the ethylene or trimethylene group are alkyl having 1–6 C atoms, in particular methyl or ethyl, hydroxyalkyl having 1 to 6 C atoms, in particular hydroxymethyl, alkoxy having 1 to 6 C atoms, in particular methoxy or ethoxy, alkoxycarbonyl having 2 to 12, in particular 2 to 6, C atoms, such as methoxycarbonyl or ethoxycarbonyl, or alkylamino or dialkylamino having 1 to 6 C atoms in the alkyl group, such as dimethylamino, as well as trialkylsilyl having 1 to 6 C atoms in the alkyl groups, such as trimethylsilyl.

A preferred sub-group of bisazides have the formula XIII

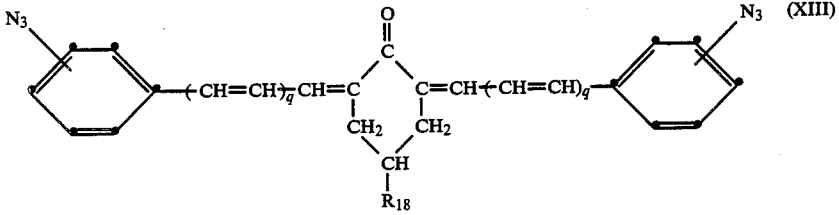

in which the azido groups are preferably bonded in the p-position q is 0 or 1, and R$_{18}$ is OH, COOH, NH$_2$, alkyl, hydroxyalkyl, alkoxycarbonyl, trialkylisilyl, alkylamino or dialkylamino. Alkyl, hydroxyalkyl, alkoxycarbonyl, trialkylsilyl, alkylamino and dialkylamino R$_{18}$s are subject to the preferences given above under R'' and R'''.

Examples of suitable polyazides are bisazidobenzene, bisazidonapthalene, bisazidotoluene, p-bisazidobiphenylene, 4,4'-bisazido-2,2'-dimethylbiphenylene, 4,4'-bisazidodiphenyl ether, 4,4'-bisazidodiphenyl ketone, 4,4'-bisazidodiphenyl sulfone, 3,3'-bisazidodiphenyl sulfide, 4,4'-bisazidodiphenylamine, 1,2-bis-(4-azidophenyl)ethylene, 1-cyano-1,2-bis-(4-azidophenyl)ethylene, 4-azidophenyl-(4-azidophenylvinyl) ketone, bis-(4-azidophenylvinyl) ketone, 1,4-bis-(4-azidophenyl)-butadiene and those of the formulae
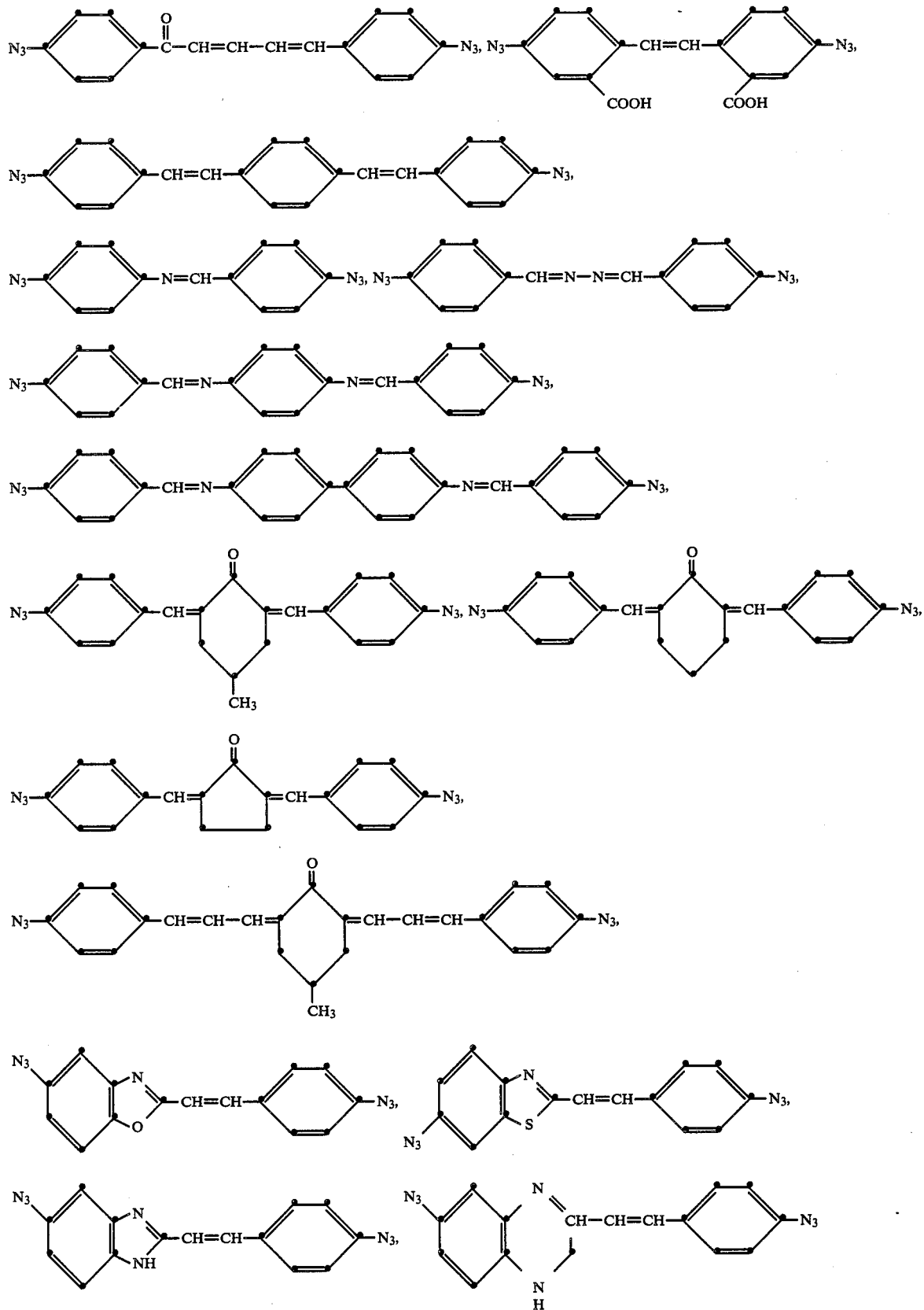

-continued
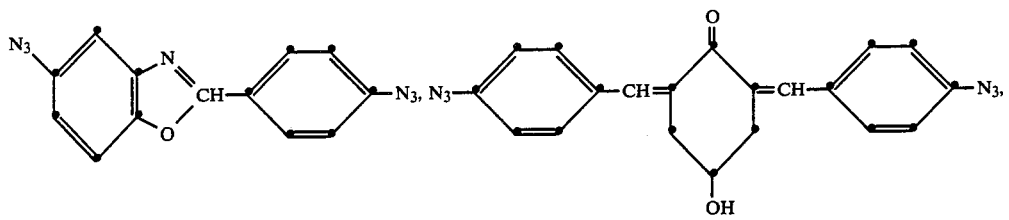
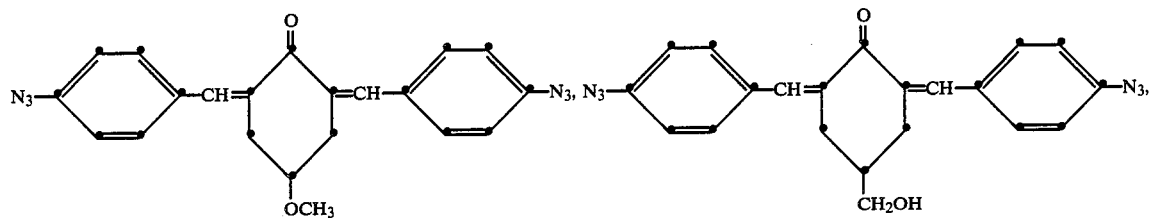
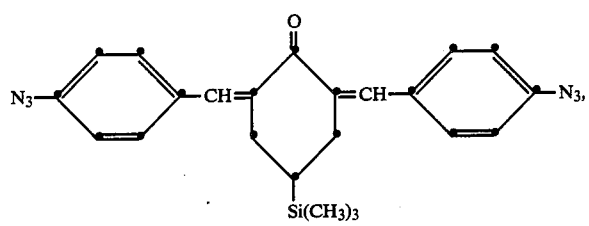
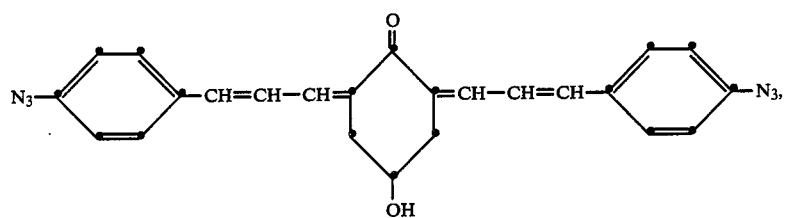
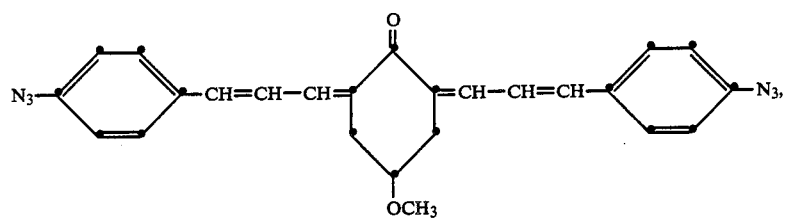
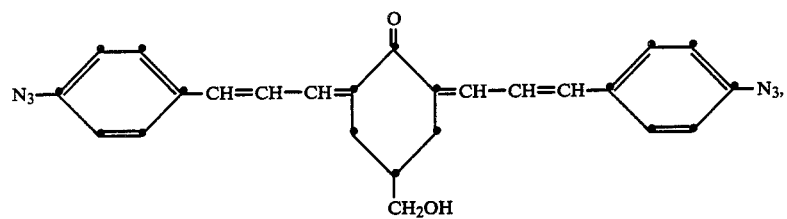
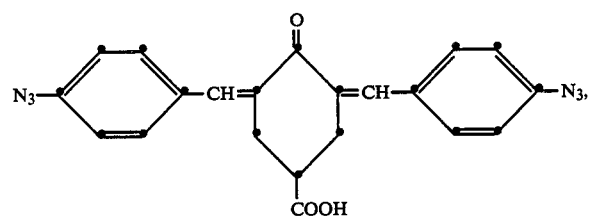

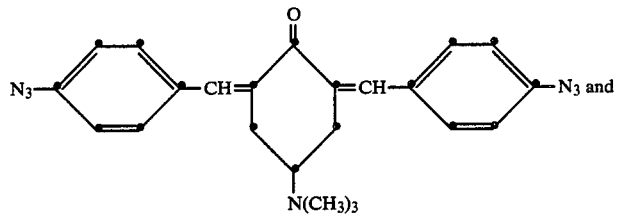

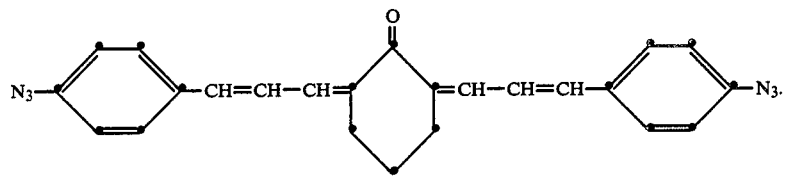

Examples of polyazides in which the axide group is bonded to aromatic hydrocarbon radicals by way of an SO₂ group are the compounds of the following formulae:

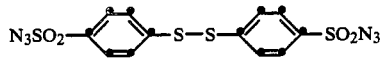

and

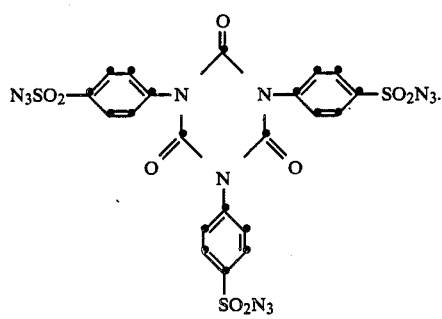

The use of polyazides where the azide groups are directly bonded to aromatic hydrocarbon radicals is preferred.

2,6-Bis(4-azidobenzylidene)-4-methylcyclohexan-1-one is particularly preferred.

The invention also provides a radiation-sensitive coating composition containing, in addition to customary additives, (a) an organic solvent, (b) a homopolyimide or copolyimide which is soluble in this solvent and which can be obtained by reacting an anhydride of the formula E

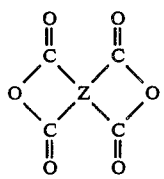 (E)

or a mixture of various anhydrides of the formula E with 50 to 100 mol % of a diamine of the formula F or G

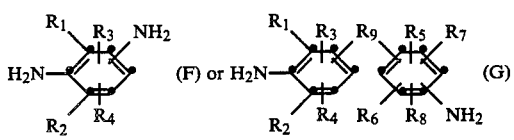

or a mixture of these diamines and with 50 to 0 mol % of a diamine of the formula H $$H_2N-Z'-NH_2 \quad (H)$$

and cyclising the resulting polyimide-acid, and (c) at least 0.1% by weight, based on component (b), of at least one organic chromophoric polyazide in which the azide groups are bonded to aromatic hydrocarbon radicals directly or via an SO₂ group, Z, Z' or R₁ to R₉ being as defined above. These radicals, as regards their preferred definitions, suitable organic solvents (a) and polyazides (c) are all subject to what is stated above.

The coating compositions according to the invention are generally prepared by dissolving the components in the organic solvent. In an advantageous procedure, first the polyimide is completely dissolved by heating and then the polyazide is admixed, with slight heating if necessary. Undissolved portions can be removed by filtration, preferably filtration with suction.

The weight composition of the coating agent according to the invention essentially depends on the desired use. It can be 80 to 99.9, preferably 85 to 99.9 and in particular 90 to 97, % by weight of polyimide (b) and 20 to 0.1, preferably 15 to 0.1 and in particular 10 to 3% by weight of polyazide (c). In the coating composition according to the invention, preferably not more than 50% by weight, in particular not more than 30% by weight and especially not more than 20% by weight, of polyimide (b) and polyazides (c) are dissolved in solvent (a), based on the solution.

The photostructuring or photocrosslinking can be brought about by high-energy radiation, for example by light within the region 600–200 nm, by X-rays, laser light, electron beams and so on and in particular by light within the region 450–300 nm.

Customary additives which have no adverse effect on the light sensitivity can be incorporated into the coating compositions. Examples of such additives are sensitisers, delustrants, flow-control agents, finely divided fillers, flame retardants, fluorescent brighteners, antioxidants, stabilisers, dyes, pigments and tackifiers.

It is also possible to add compounds which can raise the sensitivity of the aromatic polyazides. Preferred compounds of this type are described in, for example, Photographic Science and Engineering, Volume 17, Number 4, pages 390 et seq. (1973). Examples are anthrone, 1,9-benzanthrone, acridine, cyanoacridine, nitropyrene, 1,8-dinitropyrene, Michler's ketone, 5-nitroacenaphthene, 2-nitrofluorenone, 1,2-benzoanthraquinone and 2-chloro-1,8-phthaloylnaphthalene. These compounds can be used alone or mixed. The additives can also be dyes which are able to reduce the adverse effect of reflected stray light on the resolution and are referred to as antihalation agents. Compounds of this type are described in, for example, U.S. Pat. No. 4,349,619.

The light-sensitive coating composition according to the invention is a viscous fluid which has a long shelf-life but needs to be protected from the action of light and heat. It is particularly suitable for preparing insulating and protective films, in particular in electrical engineering and electronics, and for use as a photographic recording material, for example for preparing photomasks for the electronic industry, textile printing and the graphical trades.

The light-sensitive layer can be applied to suitable substrates or carrier materials by means of conventional methods, such as dipping, brushing, spraying, whirler-coating, cascade coating and curtain coating. Examples of suitable substrates are plastics, metal and metal alloys, semimetals, semiconductors, such as Si, Ge, GaAs, glass, ceramics and other inorganic materials, for example $SiO_2$ and $Si_3N_4$. Afterwards the solvent is removed by heating, if desired in vacuo, leaving non-tacky, dry and uniform films. The applied films, which have thicknesses of up to about 15 μm, preferably up to 5 μm and in particular up to 2 μm, are then cross-linked by exposure to light and are afterwards fully hardened, if desired by heat treatment. The result is protective films of excellent adhesion and high thermal, mechanical and chemical resistance for, for example, integrated circuits.

As is known, the photocrosslinking reaction with bisazides is retarded by aerobic oxygen, in particular in the case of thin films. This effect can be avoided by means of customary methods, such as by applying a temporary protective film made of, for example, polyvinyl alcohol, by working under inert gas or by attracting the photomask by means of vacuum. Furthermore, it is possible to add compounds which suppress the effect of the oxygen. Compounds of this type are described in, for example, U.S. Pat. No. 3,479,185.

The coating composition according to the invention is also highly suitable for preparing a photographic recording material for relief images. The present invention further provides such a recording material containing a carrier or substrate to which is applied a light-sensitive layer in the form of a mixture of polyimide (b) and bisazide (c). The thickness of the light-sensitive layer can be up to 15 μm, in particular up to 5 μm and especially up to 2 μm.

In the photographic recording material, the light-sensitive layer can be used for example as an etch resist for preparing printed circuits and printing plates and integrated circuits, as a solder stop finish, as a passivating film, as a dielectric medium for multilayer circuits, as a structural element for liquid crystal displays or as a filtering material for photosensors.

Preferred uses are the applying of insulating and protective finishes and especially the production of printed circuits, discrete semiconductor devices and integrated circuits.

The relief structure is generated photographically by imagewise exposure to light through a photomask, subsequent developing by removing the unexposed portions with a solvent or a solvent mixture, whereupon the generated image can be stabilised, if desired, by means of a thermal after-treatment.

The coating composition according to the invention has various further advantages. The subsequent imide formation of existing light-sensitive compositions is avoided. The good film-forming properties lead to uniform coatings which, after exposure to light and thermal after-treatment, have lost virtually no film thickness. Furthermore, the solutions have a long shelf-life, and the generated images are highly adhesive to the substrates. The relief structures obtained with the coating compositions according to the invention are furthermore distinguished by high thermal resistance in the absence of air.

The following examples illustrate the invention in more detail.

(A) Preparation of the polyimides

The polyimides are prepared by reacting the corresponding dianhydrides and diamines in N-methylpyrrolidone (NMP) and subsequently imidating the resulting polyamide-acids with acetic anhydride.

The polymers are characterised by the inherent viscosity ($\eta_{inh}$) of 0.5% solutions in NMP at 25° C. and by the average molecular weights ($\overline{M}_w$) which are determined by measuring the light scattering.

The determination of the average molecular weight by light scattering is carried out on the Chromatix KMX-6 lightscattering equipment, where laser light of 632.8 nm is used for the stimulating and the forward scatter within the angle range 6°–7° is measured.

PREPARATION EXAMPLE 1

In a cylindrical vessel which is equipped with a stirrer, a dripping funnel, an internal thermometer and a nitrogen inlet tube, 10.16 g (0.04 mol) of 4,4'-diamino-3,3',5,5'-tetramethyldiphenylmethane are dissolved in 130 ml of N-methyl-2-pyrrolidone (NMP) under nitrogen, and the solution is cooled down to 0° to 5° C. 0.02 mol each of 3,3',4,4'-benzophenonetetracarboxylic acid dianhydride (BTDA) and of pyromellitic acid dianhydride (PMDA) is prepared and is added a little at a time in the course of 4 hours. 30 minutes after the final portion has been added, 8.9 g (0.09 mol) of triethylamine and 36.7 g (0.36 mol) of acetic anhydride are added dropwise in order to cyclise the polyamide-acid formed to the polyimide. After 16 hours of stirring at room temperature the solution is poured with vigorous stirring onto 2 liters of water, and the precipitated product is filtered off. The product is treated again with 2 liters of water, is filtered off and is dried at 80° C. in vacuo. The inherent viscosity, measured at 25° C. on a 0.5% solution in NMP, is 0.75 dl/g. The glass transition temperature (Tg), measured by differential scanning calometry (DSC), is 403° C.; average molecular weight $\overline{M}_w = 38,000$.

PREPARATION EXAMPLE 2

Example 1 is repeated using 0.04 mol of 3,3',4,4'-benzophenonetetracarboxylic acid dianhydride and 0.04 mol of 1,4-diamino-2,3,4,5-tetramethylbenzene. Properties of the polyimide obtained: $\eta_{inh.}=0.92$ dl/g; $Tg=439°$ C.; average molecular weight $\overline{M}w=42,000$.

PREPARATION EXAMPLE 3

5 g of the polymer obtained in Preparation Example 2 are dissolved in 100 g of 4-butyrolactone, and the solution is subjected to fractionation with the dropwise addition of toluene. Within the toluene: 4-butyrolactone ratio range from 1.00 to 1.10, 1.2 g of a polymer fraction with $\eta_{inh.}=1.42$ dl/g and an average molecular weight $\overline{M}_w$ of 155,000 are isolated.

PREPARATION EXAMPLES 4–7

Using the method described in Examples 1 and 2, various diamine mixtures are reacted with an equivalent amount of BTDA and then cyclised to the polyimide, and if desired the polyimide is subjected to a fractionation as in Preparation Example 3.

The diamines used and the properties of the polyimides obtained are indicated in Table 1 below.

than indicated hereinafter, only those times are given here where an exact 1:1 image of all geometrical figures of the same size as or larger than 4 times the film thickness (equality of troughs and stays) is observed.

Developing takes place under a pressure of 2 bar at between 500 and 2,000 revolutions per minute, for which developing times between 6 and 35 seconds are necessary, in a spray developer. The film thickness is determined by means of a profilometer from the firm of Tencor (Alpha-Step).

The exposure energy and the resolution are assessed using criteria which correspond for, example, to the criteria given in L. F. Thompson, G. G. Willson, N. J. Bowden, "Introduction to Microlithography", ACS Symposium Series 219, Washington D.C., 1983, pages 162–172. To measure the electrical properties of said coatings, the photosensitive mixtures described are whirler-coated with a solids content of 8–20% by weight onto aluminium substrates in the form of 20 μm thick films, which are exposed. After the appropriate

TABLE 1

| Example No. | Diamine 1 | Mol % | Diamine 2 | Mol % | η inh. dl/g | Tg (°C.) |
|---|---|---|---|---|---|---|
| 4 | 2,3,5,6-tetramethyl-1,4-phenylenediamine | 50 | bis(3,5-dimethyl-4-aminophenyl)methane | 50 | 0.76 | 377 |
| 5 | 2,3,5,6-tetramethyl-1,4-phenylenediamine | 50 | bis(3-ethyl-5-methyl-4-aminophenyl)methane | 50 | 0.78 | 364 |
| 6 | 2,3,5,6-tetramethyl-1,4-phenylenediamine | 70 | H$_2$N—(CH$_2$)$_3$—Si(CH$_3$)$_2$—O—Si(CH$_3$)$_2$—(CH$_2$)$_3$—NH$_2$ | 30 | 0.71 | 276 |
| 7 | 2,6-diethyl-3-amino-4-methylaniline (tetrasubstituted phenylenediamine with C$_2$H$_5$, NH$_2$, C$_2$H$_5$, CH$_3$) | 90 | 4,4'-oxydianiline | 10 | 0.78* | 388 |

*fractionated

(B) Application examples

The subtrates in the following application examples are 3-inch silicon wafers coated with 0.1 μm of SiO$_2$. Exposure is to the light from a mask alignment and exposure machine from the firm of Karl Süss, the intensity of the light being determined by means of an intensity meter from the firm of Optical Associates Inc. The data refer to the 365 nm probe. Use is made of a black chromium mask which contains test patterns of all geometric shapes customary in semiconductor manufacture, in the sizes 1 μm, 2 μm, 3 μm ... 10 μm, 20 μm ... 100 μm. Although well defined image structures can be produced even with exposure times much shorter thermal treatment in an inert gas atmosphere in a heat treatment furnace (for example N$_2$, 2 hours, 400°±2° C.) and after cooling down, the samples are provided on the surface with conductive silver, are preconditioned at 110° C. for 30 minutes and are then measured at room temperature by means of an L-8 Megohm meter from the firm of Beckmann Instruments Inc.

EXAMPLE I

A 9.0% solution in 4-butyrolactone is prepared from a polyimide obtained as in Preparation Example 1, and 7% by weight, based on the polymer, of the 2,6-bis-(4- azidobenzylidene)-4-methylcyclohexan-1-one bisazide are admixed.

The solution is filtered through an 0.45 μm filter and is whirler-coated at 3,400 revolutions per minute onto SiO$_2$-coated 3-inch wafers, and the films are dried at 60° C. in a circulating air current for 10 minutes. They are exposed with simultaneous N$_2$ gas injection through a vacuum contact black chromium mask. The developing conditions in the spray developer are as follows:

| | |
|---|---|
| toluene/4-butyrolactone (2.40:1.00 by weight) | 8 sec |
| toluene/4-butyrolactone (5.80:1.00 by weight) | 2 sec |
| toluene | 3 sec. |

An exposure energy of 850 mJ/cm$^2$ produces a faithful image of the mask in which even the resolution of the 2 μm stays and troughs is still good. The height of the relief structures is 0.99 μm.

The wafers are then placed into a heat-treatment furnace, where, in an N$_2$ atmosphere, they are raised to 400° C. in the course of 1 hour 20 minutes, are left there for 10 minutes and are then cooled down. The film thickness is then 0.90 μm, and the relief structures are even resistant to powerful chemical stress, such as dipping into hot N-methyl-2-pyrrolidone with the simultaneous application of ultrasonics. The relief structures are then exposed to thermal stress by heating them up to 400° C. and then leaving them at temperatures between 400° and 450° C. for 1 hour. When they have cooled down the film thickness is still 0.89 μm. No geometric changes in the relief images are visible under a high resolution microscope.

A 20 μm thick film of the composition described above is treated at 400° C. in an N$_2$ atmosphere for 2 hours. Afterwards the specific volume resistance $\rho D$ is measured as $2.1 \times 10^{16}$ ohm.cm.

EXAMPLE II

A 6.75% solution in 4-butyrolactone is prepared from a polymer obtained as in Preparation Example 2. 7%, based on the polymer, of 2,6-bis-(4-azidobenzylidene)-4-methylcyclohexan-1-one is added to the solution, which is filtered through a 0.45 μm filter and is whirler-coated at 1,900 revolutions per minute onto SiO$_2$-coated 3-inch wafers. After drying at 60° C. in a circulating air cabinet for 10 minutes the films are exposed with additional N$_2$ gas injection through a vacuum contact chromium mask. The subsequent developing conditions in the spray developer are as follows (2 bar spray pressure):

| | |
|---|---|
| toluene/4-butyrolactone (1.07:1.00 by weight) | 9 sec |
| toluene/4-butyrolactone (3.00:1.00 by weight) | 2 sec |
| toluene | 3 sec. |

An exposure energy of 1,100 mJ/cm$^2$ produces a faithful image of the mask in which the resolution of the 2 μm stays and troughs is still good. The height of the relief structures is measured with a profilometer and is found to be 1.00 μm.

The film-coated and photostructured wafers are then placed into a heat-treatment furnace and are heated in an N$_2$ atmosphere to 400° C. in the course of 1 hour 20 minutes and are left at that temperature for 10 minutes. After cooling down the film thickness is still 0.88 μm, and the relief structures can even withstand a 10-minute treatment in hot N-methyl-2-pyrrolidone at 60° C. with the simultaneous application of ultrasonics. The wafers are then placed into the heat-treatment furnace for a second time, are heated in an N$_2$ atmosphere to 400° C. in the course of 1 hour 15 minutes and are then left at temperatures between 400° and 450° C. for 1 hour. After cooling down a film thickness of 0.86 μm is measured, and no geometric changes in the relief pattern are visible under a high resolution microscope.

A 20 μm thick film of the composition described above is treated at 400° C. in an N$_2$ atmosphere for 2 hours. Afterwards the specific volume resistance $\rho D$ is measured as $2.4 \times 10^{16}$ ohm.cm. Even after 2 hours of treatment at 450° C. the $\rho D$ is still $1.7 \times 10^{16}$ ohm.cm.

EXAMPLE III

A 0.5% solution in 4-butyrolactone of the polymer obtained in Preparation Example 3 has added to it 6% by weight, based on the polymer, of the bisazide 2,6-bis-(4-azidobenzylidene)-4-methylcyclohexan-1-one. The solution is processed analogously to Application Example II. The developing conditions are 35 seconds with a mixture of 4-butyrolactone and toluene (weight ratio 1:0.4). An exposure energy of 135 mJ/cm$^2$ is necessary in order to produce highly resolved structures (resolution=2 μm) for a 1.07 μm film thickness, the image of the mask being dimensionally faithful. The structures are then heated at 400° C. for 10 minutes as in Application Examples I and II, and become chemically totally inert. The film thickness is then 0.94 μm. After a further, 1-hour period at 400°–450° C. the film thickness is 0.92 μm.

APPLICATION EXAMPLES IV–VII

The polymers obtained in Preparation Examples 4–7 are dissolved in 4-butyrolactone, 6% by weight, based on the polymer, of 2,6-bis-(4-azidobenzylidene)-4-methylcyclohexan-1-one is added to each solution, which is filtered and then whirler-coated onto silicon wafers or aluminium substrates. The processing data and the electrical properties of the films thus prepared can be seen in Table 2.

TABLE 2

| Polymer No. | Developer (weight ratio) | Developing time (sec) | Film thickness (μm) | Film thickness after 1 hour at 400° C. (μm) | Exposure energy (mJ/cm$^2$) | Specific volume resistance ohm.cm$^2$ | Resolution (μm) |
|---|---|---|---|---|---|---|---|
| 4 | NMP:MEK 1:1.52 | 6 | 0.99 | 0.92 | 1,200 | $1.3 \times 10^{16}$ | 2 |
| 5 | GBL:Tol 1:2.00 | 11 | 1.08 | 0.98 | 560 | $1.4 \times 10^{16}$ | 2 |
| 6 | GBL:Tol 1:2.00 | 15 | 1.52 | 1.37 | 560 | $1.1 \times 10^{16}$ | 3 |

TABLE 2-continued

| Polymer No. | Developer (weight ratio) | Developing time (sec) | Film thickness (μm) | Film thickness after 1 hour at 400° C. (μm)[1] | Exposure energy (mJ/cm$^2$) | Specific volume resistance ohm.cm$^2$[2] | Resolution (μm) |
|---|---|---|---|---|---|---|---|
| 7 | GBL:Tol 1:1.80 | 12 | 1.01 | 0.90 | 610 | $1.3 \times 10^{16}$ | 2 |

NMP = N—methyl-2-pyrrolidone
MEK = methyl ethyl ketone
GBL = 4-butyrolactone
Tol = toluene
[1]after the developing
[2]after 2 hours at 400° C. in an N$_2$ atmosphere in accordance with DIN 53,482, on aluminum substrate

What is claimed is:

1. A radiation sensitive polymeric coating composition consisting essentially of (a) an organic solvent, and dissolved therein as the active radiation-sensitive component system, (b) from 80.0 to 99.9%, by weight of the component system, of a homopolyimide or copolyimide which essentially comprises 50 to 100 mol % of recurring structural elements of the formulae Ia and/or Ib

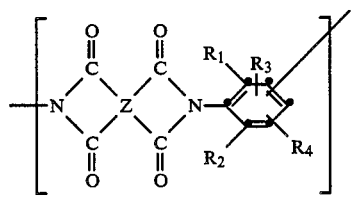

(Ia)

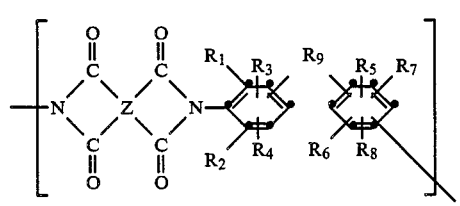

(Ib)

and 50 to 0 mol % of recurring structural elements of the formula II

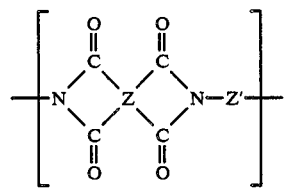

(II)

and (c) from 0.1 to 20.0%, by weight of the component system, of at least one organic chromophoric polyazide in which the azide groups are bonded to aromatic hydrocarbon radicals either directly or via an SO$_2$ group, the four carbonyl groups in the formula Ia, Ib and II being bonded to different carbon atoms and any two carbonyl groups being in ortho- or peri-position relative to each other, Z being a tetravalent radical which contains at least one aromatic ring, Z' being a divalent organic radical which differs from the groups of the formulae

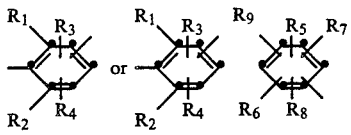

and is selected from among aromatic, alkylaromatic, aliphatic, cycloaliphatic and heterocyclic radicals, combinations thereof and radicals having oxygen-, sulfur-, nitrogen-, silicone- or phosphorus-containing bridge groups, R$_1$ and R$_2$, independently of each other, each being alkyl having 1–4 C atoms, R$_3$, R$_4$, R$_5$, R$_6$, R$_7$ and R$_8$, independently of one another, each being hydrogen, or alkyl having 1–4 C atoms and R$_9$ being a direct bond, —O—, —S—, —SO—, —S—S—, —SO$_2$—, —CO—, —COO—, —NH—,

alkyl having 1–6 C atoms in the alkyl,

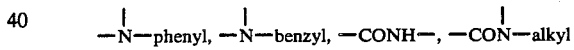

having 1–6 C atoms in the alkyl,

a linear or branched alkylene group having 1–3 C atoms, alkylidene having 2–12 C atoms, cycloalkylidene having 5–6 ring carbon atoms, phenylene,

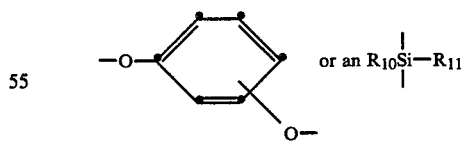

group in which R$_{10}$ and R$_{11}$ are each alkyl or alkoxy having 1–6 C atoms each, phenyl, benzyl, phenyloxy or benzyloxy.

2. Radiation-sensitive coating as claimed in claim 1, in which the azide groups of the chromophoric polyazide are bonded to aromatic hydrocarbon radicals via direct bonds.

3. Radiation-sensitive coating composition as claimed in claim 1, in which Z is one or more of the structures

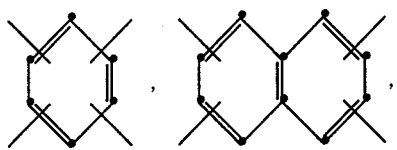

(1)　　(2)

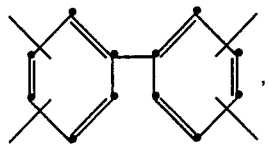

(3)

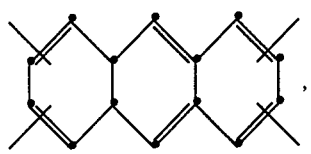

(4)

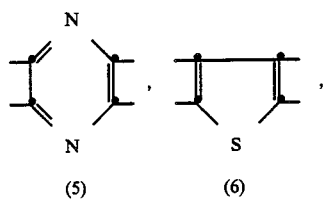

(5)　　(6)

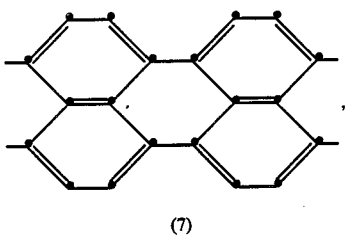

(7)

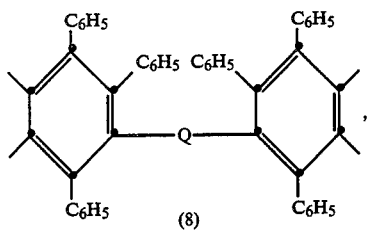

(8)

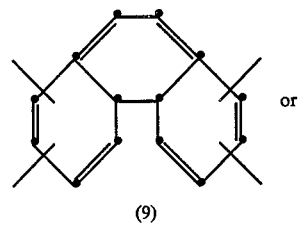 or (9)

-continued

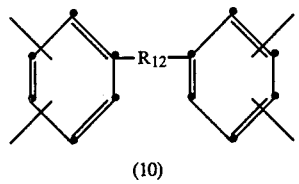

(10)

in which Q is 1,3- or 1,4-phenylene or a diphenyl ether radical and $R_{12}$ is selected from the group consisting of $$-O-, -S-, -SO_2-, -\overset{O}{\underset{\|}{C}}-\overset{R_{10}}{\underset{|}{N}}-, -\overset{O}{\underset{\|}{C}}-, -\overset{O}{\underset{\|}{C}}-O-,$$

$$-\overset{R_{10}}{\underset{R_{10}}{\underset{|}{N}}}-, -\overset{R_{10}}{\underset{R_{11}}{\underset{|}{Si}}}-, -O-\overset{R_{10}}{\underset{R_{11}}{\underset{|}{Si}}}-O-, -\overset{R_{10}}{\underset{O}{\underset{\|}{P}}}-, -O-\overset{R_{10}}{\underset{O}{\underset{\|}{P}}}-O-,$$

$$-N{=}N-, -\underset{\underset{O}{|}}{N}{=}N-, -NH-, -\overset{O}{\underset{\|}{C}}-\overset{H}{\underset{|}{N}}-, -CH_2-,$$

$$-CH_2-CH_2-, -\overset{R_{10}}{\underset{|}{CH}}-\text{ and } -\overset{R_{10}}{\underset{R_{11}}{\underset{|}{C}}}-,$$

where $R_{10}$ and $R_{11}$ are as defined in claim 1.

4. Radiation-sensitive coating composition as claimed in claim 1, in which Z is the radical of pyromellitic acid dianhydride, a radical of the formula VI

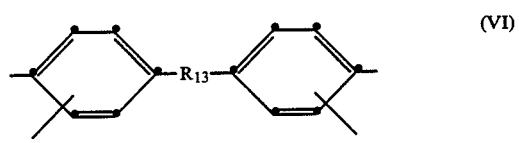

(VI)

or a mixture of these radicals, in which $R_{13}$ is a direct bond, —CH₂—, —O—, —SO₂— or —CO—.

5. Radiation-sensitive coating composition as claimed in claim 1, in which Z is the radical of pyromellitic acid dianhydride, a radical of the formula VIa

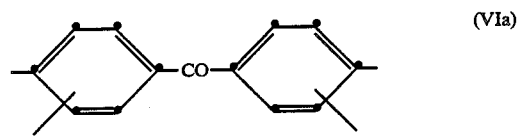

(VIa)

or a mixture of these radicals.

6. Radiation-sensitive coating composition as claimed in claim 1, in which $R_1$ and $R_2$, independently of each other, are each methyl or ethyl, $R_3$ to $R_8$, independently of one another, are each hydrogen, methyl or ethyl, and $R_9$ is —CH₂—, —O—, —CO— or a direct bond.

7. Radiation-sensitive coating composition as claimed in claim 1, in which $R_1$ and $R_2$ are both methyl or ethyl, and $R_3$ and $R_4$, independently of each other, are each hydrogen or methyl, the free bond being in the meta- or in the para-position relative to the N atom.

8. Radiation-sensitive coating composition as claimed in claim 1, in which the structural elements of the formula Ia are derived from diamines of the formulae A, B, C or D

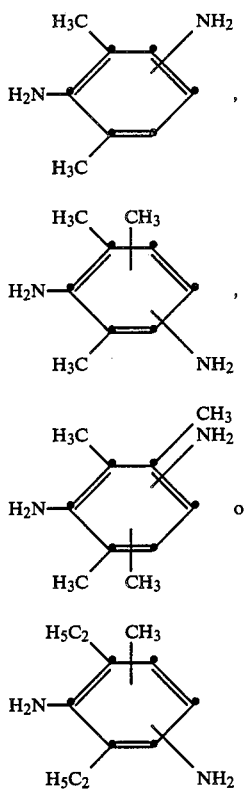

or mixtures thereof in which the amino groups are in the meta- or in the para-position relative to each other.

9. Radiation-sensitive coating composition as claimed in claim 1, in which the structural elements of the formula Ib are derived from symmetrical diamines of the formula III

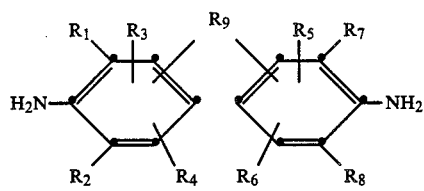

in which $R_9$ is a direct bond, —$CH_2$— or —CO—, $R_1$, $R_2$, $R_7$ and $R_8$ are all $C_{1-4}$-alkyl, and $R_3$ and $R_5$ on the one hand and $R_4$ and $R_6$ on the other are defined the same way and are each hydrogen or $C_{1-4}$-alkyl.

10. Radiation-sensitive coating composition as claimed in claim 1, in which the structural elements of the formula Ib are derived from diamines of the formula IIIa

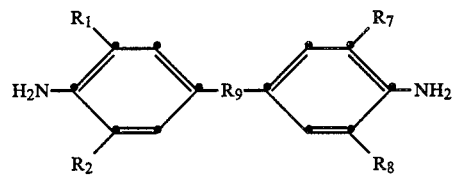

in which $R_1$ and $R_7$ are each methyl, $R_2$ and $R_8$ are each methyl or ethyl, and $R_9$ is a direct bond, —CO— or —$CH_2$—.

11. Radiation-sensitive coating composition as claimed in claim 1, in which homopolyimide or copolyimide (b) essentially comprises 70 to 100 mol % of recurring structural elements of the formula Ia or Ib or mixtures thereof and 30 to 0 mol % of recurring structural elements of the formula II in which Z is the radical of pyromellitic acid dianhydride, a radical of the formula VI

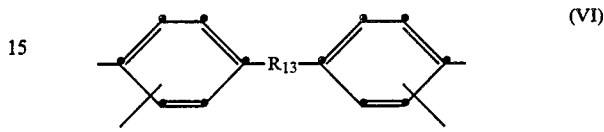

or a mixture of these radicals, $R_1$ and $R_2$, independently of each other, are each methyl or ethyl, $R_3$ to $R_8$, independently of one another, are each hydrogen, methyl or ethyl, and $R_9$ is —$CH_2$—, —O—, —CO or a direct bond, and Z' is a radical of the formula IX or X

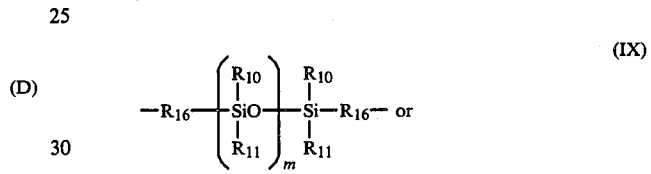

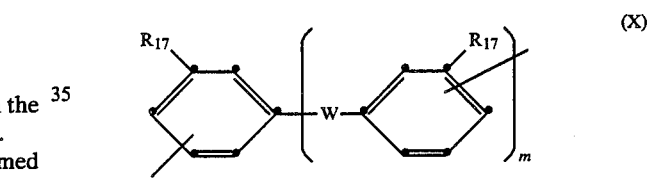

in which $R_{13}$ is a direct bond, —$CH_2$—, —O—, —$SO_2$— or —CO—, m is zero or 1, x is an integer from 1 to 50, $R_{16}$ is alkylene having 1–6 C atoms, $R_{17}$ is a hydrogen atom, alkyl or alkoxy having 1–5 C atoms, the free bonds in the formula X are in the meta- or in the ortho-position relative to the $R_{17}$ group, W is a direct bond, —S—, —CO—, —NH—, —N—alkyl having 1–5 C atoms in the alkyl, —O—, —SO—, —S—S—, —N—phenyl, —$SO_2$—, a linear or branched alkylene group having 1–3 C atoms, alkylidene having 2–12 C atoms, cycloalkylidene having 5 or 6 ring carbon atoms, phenylene or an

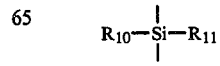

group, and $R_{10}$ and $R_{11}$ are each alkyl or alkoxy having 1-6 C atoms, phenyl, benzyl, phenyloxy or benzyloxy.

12. Radiation-sensitive coating composition as claimed in claim 11, in which homopolyimide or copolyimide (b) essentially comprises 70 to 100 mol % of recurring structural elements of the formula Ia or Ib or mixtures thereof and 30 to 0 mol % of recurring structural elements of the formula II in which Z is the radical of pyromellitic acid dianhydride, a radical of the formula VIa

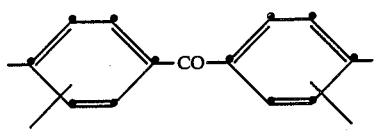
(VIa)

or a mixture of these radicals and in which the structural elements of the formula Ia are derived from diamines of the formulae A, B, C or D

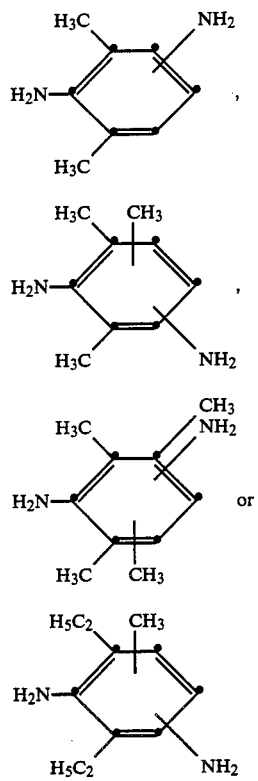

or mixtures thereof and structural elements of the formula Ib are derived from diamines of the formula IIIa

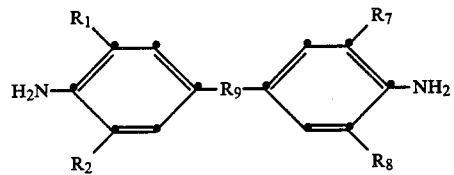
(IIIa)

where the amino groups in the formulae A, B, C and D are in the meta- or in the para-position relative to each other, $R_1$ and $R_7$ are each methyl, $R_2$ and $R_8$ are each methyl or ethyl. $R_9$ is a direct bond. —CO— or —CH$_2$—, Z' is a radical of the formula X in which m is zero or 1, W is a direct bond, —CO—, —CH$_2$— or —O— and $R_{17}$ is a hydrogen atom.

13. Radiation-sensitive coating composition as claimed in claim 11, in which homopolyimide or copolyimide (b) essentially comprises 70 to 100 mol % of recurring structural elements of the formula Ia or Ib or mixtures thereof and 30 to 0 mol % of recurring structural elements of the formula II in which Z is the radical of pyromellitic acid dianhydride, a radical of the formula VIa

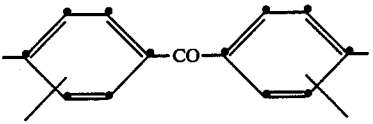
(VIa)

or a mixture of these radicals and in which the structural elements of the formula Ia are derived from diamines of the formulae A, B, C or D

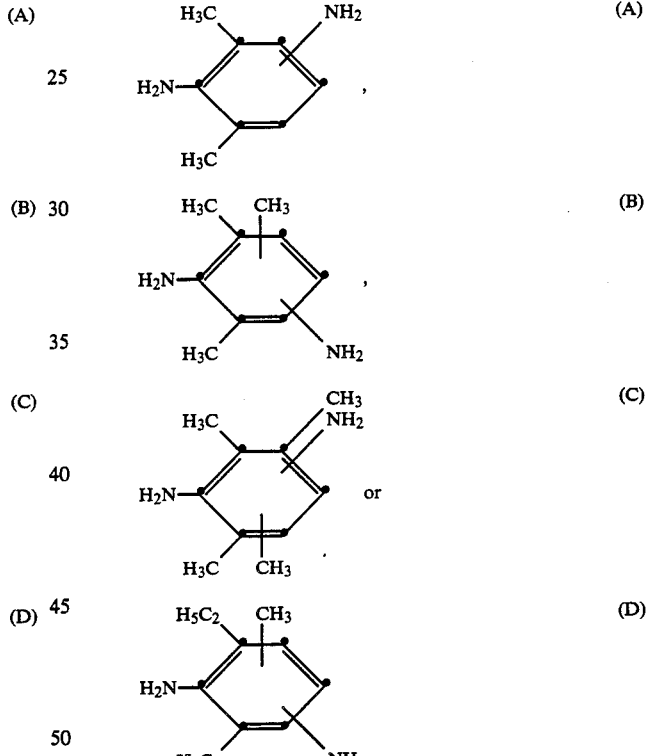

or mixtures thereof and the structural elements of the formula Ib are derived from diamines of the formula IIIa

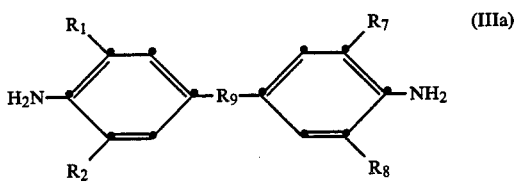
(IIIa)

where the amino groups in the formulae A, B, C and D are in the meta- or in the para-position relative to each other, $R_1$ and $R_7$ are each methyl, $R_2$ and $R_8$ are each methyl or ethyl, $R_9$ is a direct bond, —CO— or —CH₂— and Z' is a radical of the formula IX in which x is 1, the $R_{10}$s and $R_{11}$s are all methyl, and $R_{16}$ is alkylene having 1-6 C atoms.

14. Radiation-sensitive coating composition as claimed in claim 11, in which homopolyimide or copolyimide (b) comprises 100 mol % of recurring structural elements of the formula Ia or Ib or mixtures thereof, Z is the radical of pyromellitic acid dianhydride, a radical of the formula VIa

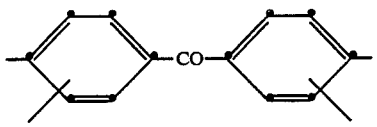
(VIa)

or a mixture of these radicals, and in which the structural elements of the formula Ia are derived from diamines of the formulae A, B, C or D

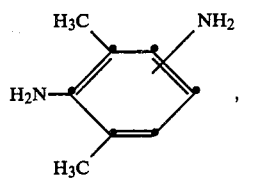
(A)

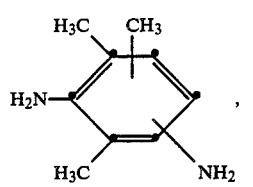
(B)

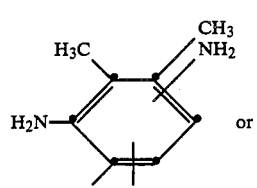
(C)

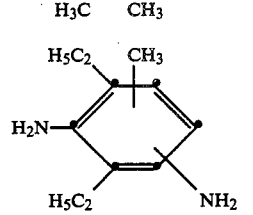
(D)

or mixtures thereof and the structural elements of the formula Ib are derived from 4,4'-diamino-3,5,3',5'-tetramethyldiphenylmethane.

15. Coating composition as claimed in claim 1, wherein the solvent is a polar aprotic solvent.

16. Coating composition as claimed in claim 1, wherein the chromophoric polyazide is a bisazide of the formula XII $$N_3-E-(Y)_q-E-N_3 \qquad (XII)$$

in which E is an aromatic hydrocarbon radical, q is 0 or 1, and Y is an inorganic or organic group which, together with the aromatic hydrocarbon radicals E, forms a mesomeric system.

17. Coating composition as claimed in claim 16, in which Y is O, CO, S, SO, SO₂, NR' where R' is hydrogen, alkyl, cycloalkyl, aryl or aralkyl,

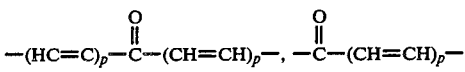

or $-(CH=CH)-_p$ where p=1-3, $-CH=N-$,

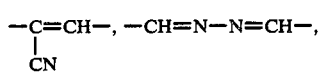

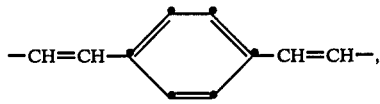

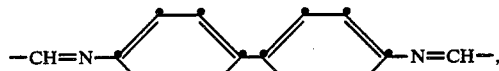

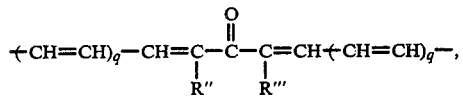

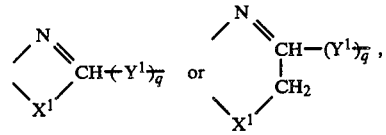

in which R" and R"', independently of each other, are each alkyl having 1 to 5 C atoms or R" and R"' together are unsubstituted or alkyl-, hydroxyalkyl-, alkoxy-, trialkylsilyl-, hydroxyl-, carboxyl-, alkoxycarbonyl-, amino-, alkylamino- or dialkylamino-substituted ethylene or trimethylene, q is 0 or 1, X¹ is O, S or NH, Y¹ is independently defined in the same way as Y, and the free bonds on N and X¹, together with the E group, form a fused heterocyclic ring.

18. Coating composition as claimed in claim 1, wherein the polyazide is 2,6-bis(4-p-azidobenzylidene)-4-methylcyclohexan-1-one.

19. Photographic recording material for relief images, containing a carrier to which is applied a radiation-sensitive layer in the form of a mixture of polyimide (b) and polyazide (c) as claimed in claim 1.

* * * * *